(12) United States Patent
Heilmann et al.

(10) Patent No.: US 10,899,044 B2
(45) Date of Patent: Jan. 26, 2021

(54) MOLD, METHOD FOR THE PRODUCTION AND USE THEREOF, PLASTIC FILM AND PLASTIC COMPONENT

(71) Applicant: Fraunhofer Gesellschaft Zur Förderung Der Angewandten Forschung E.V., Munich (DE)

(72) Inventors: Andreas Heilmann, Augustusburg (DE); Annika Thormann, Halle (DE)

(73) Assignee: Fraunhofer Gesellschaft Zur Forderung Der Angewandten Forschung E.V., Munich (DE)

( * ) Notice: Subject to any disclaimer, the term of this patent is extended or adjusted under 35 U.S.C. 154(b) by 691 days.

(21) Appl. No.: 15/316,493

(22) PCT Filed: Jun. 2, 2015

(86) PCT No.: PCT/EP2015/062238
§ 371 (c)(1),
(2) Date: Dec. 5, 2016

(87) PCT Pub. No.: WO2015/185540
PCT Pub. Date: Dec. 10, 2015

(65) Prior Publication Data
US 2017/0136660 A1  May 18, 2017

(30) Foreign Application Priority Data

Jun. 5, 2014 (DE) .................. 10 2014 210 798

(51) Int. Cl.
*B29C 33/38* (2006.01)
*B29C 33/42* (2006.01)
(Continued)

(52) U.S. Cl.
CPC ........ *B29C 33/3842* (2013.01); *B23K 26/361* (2015.10); *B23K 26/362* (2013.01);
(Continued)

(58) Field of Classification Search
CPC ........ B29C 33/3842; B29C 2035/0827; B29C 2035/0822; B29C 2059/023;
(Continued)

(56) References Cited

U.S. PATENT DOCUMENTS 5,785,840 A  7/1998 Sondergeld
5,800,772 A  9/1998 Kurasawa
(Continued)

FOREIGN PATENT DOCUMENTS

CN  102205639 A  10/2011
DE  102006012960 A1  9/2007
(Continued)

OTHER PUBLICATIONS

EPO Office Action dated Aug. 21, 2018 with English Translation.
(Continued)

*Primary Examiner* — Robert C Dye
*Assistant Examiner* — Taryn Trace Willett
(74) *Attorney, Agent, or Firm* — Alix, Yale & Ristas, LLP

(57) ABSTRACT

The invention relates to a method for creating a surface structure on a mold, wherein first structural elements are created using a laser structuring process in a first step, and second structural elements, which are smaller than the first structural elements, are created using an anodic oxidation process in another step following the laser structuring process. The invention further relates to a mold of said type and finally to a plastic film or a plastic component having a surface structure as well as to a method for the production thereof.

7 Claims, 6 Drawing Sheets a)

b)

(51) Int. Cl.

| | | |
|---|---|---|
| *B29C 35/08* | (2006.01) | |
| *B29C 59/02* | (2006.01) | |
| *C25D 11/26* | (2006.01) | |
| *B29C 35/02* | (2006.01) | |
| *C25D 11/16* | (2006.01) | |
| *B29C 37/00* | (2006.01) | |
| *C25D 11/18* | (2006.01) | |
| *B23K 26/361* | (2014.01) | |
| *B23K 26/362* | (2014.01) | |
| *C23C 16/40* | (2006.01) | |
| *C25D 11/08* | (2006.01) | |
| *C25D 11/10* | (2006.01) | |
| *C25D 11/24* | (2006.01) | |
| *B23K 103/10* | (2006.01) | |
| *B23K 103/14* | (2006.01) | |
| *B29K 105/16* | (2006.01) | |
| *B29L 7/00* | (2006.01) | |
| *B29C 45/37* | (2006.01) | |
| *C25D 11/12* | (2006.01) | |
| *C22F 1/04* | (2006.01) | |
| *C22F 1/18* | (2006.01) | |

(52) U.S. Cl.
CPC ........ *B29C 33/424* (2013.01); *B29C 35/0272* (2013.01); *B29C 35/0805* (2013.01); *B29C 37/0053* (2013.01); *B29C 59/022* (2013.01); *B29C 59/026* (2013.01); *C23C 16/403* (2013.01); *C25D 11/08* (2013.01); *C25D 11/10* (2013.01); *C25D 11/16* (2013.01); *C25D 11/18* (2013.01); *C25D 11/24* (2013.01); *C25D 11/26* (2013.01); *B23K 2103/10* (2018.08); *B23K 2103/14* (2018.08); *B29C 45/372* (2013.01); *B29C 2035/0822* (2013.01); *B29C 2035/0827* (2013.01); *B29C 2059/023* (2013.01); *B29K 2105/162* (2013.01); *B29K 2905/02* (2013.01); *B29K 2905/08* (2013.01); *B29K 2995/0056* (2013.01); *B29K 2995/0092* (2013.01); *B29L 2007/001* (2013.01); *C22F 1/04* (2013.01); *C22F 1/183* (2013.01); *C25D 11/12* (2013.01)

(58) Field of Classification Search
CPC .............. B29C 35/0272; B29C 45/372; B29C 37/0053; B29C 59/026; B29C 59/022; B29C 35/0805; B29C 33/424; C23C 16/403; C22F 1/183; C22F 1/04; B29L 2007/001; B29K 2105/162; B29K 2995/0056; B29K 2995/0092; B29K 2905/08; B29K 2905/02; C25D 11/16; C25D 11/12; C25D 11/18; C25D 11/24; C25D 11/10; C25D 11/08; C25D 11/26; B23K 26/361; B23K 26/362; B23K 2103/14; B23K 2103/10
See application file for complete search history.

(56) References Cited

U.S. PATENT DOCUMENTS

| | | | |
|---|---|---|---|
| 6,949,272 B2 | 9/2005 | Wochnowski et al. | |
| 7,875,147 B2* | 1/2011 | Boehm | B23K 26/18 |
| | | | 156/272.8 |
| 8,021,628 B2 | 9/2011 | Feisel et al. | |
| 8,741,204 B2* | 6/2014 | Kast | B29C 59/02 |
| | | | 264/293 |
| 8,895,438 B2* | 11/2014 | Peter | G03F 7/0002 |
| | | | 264/293 |
| 9,691,873 B2* | 6/2017 | Rogers | H01L 31/08 |
| 2003/0049396 A1 | 3/2003 | Oles et al. | |
| 2003/0071016 A1 | 4/2003 | Shih et al. | |
| 2005/0233083 A1 | 10/2005 | Schulz et al. | |
| 2007/0035056 A1 | 2/2007 | Suehira et al. | |
| 2008/0233404 A1 | 9/2008 | Wolk et al. | |
| 2011/0048254 A1 | 3/2011 | Espe et al. | |
| 2011/0086204 A1 | 4/2011 | Wohl, Jr. et al. | |
| 2011/0217544 A1* | 9/2011 | Young | B29C 37/0032 |
| | | | 428/327 |
| 2013/0140744 A1 | 6/2013 | Nakai et al. | |
| 2014/0227377 A1 | 8/2014 | Kast | |
| 2016/0251749 A1* | 9/2016 | Wu | C25D 11/026 |
| | | | 428/632 |

FOREIGN PATENT DOCUMENTS

| | | |
|---|---|---|
| DE | 102008038014 A1 | 2/2010 |
| EP | 1069984 B1 | 10/2002 |
| EP | 1289734 B1 | 7/2004 |
| EP | 2052844 B1 | 5/2010 |
| EP | 2286980 A1 | 2/2011 |
| JP | 2008126448 A | 6/2008 |
| KR | 20140033851 A | 3/2014 |
| WO | 2006046058 A2 | 5/2006 |
| WO | 2008048913 A1 | 4/2008 |
| WO | 2009029435 A1 | 3/2009 |
| WO | 2009129801 A1 | 10/2009 |

OTHER PUBLICATIONS

Burr, August et al., "Konzepte und Anwendungen der hochdynamischen variothermen Spritzgießtechnologie," Research Report (2010).

Ehret, Gerd et al., "Reduzierung der Grenzflächenreflexion von PMMA durch stochastische Strukturierung [Reduction in the Interface Reflection of PMMA by Stochastic Structuring]," DGaO-Proceedings (2006).

Kinkel, Steffen et al., "Intelligenter produzieren [Produce in a more intelligent way]," VDMA Verlag (2005).

Michaeli, Walter et al., "Dynamische Walzentemperierung [Surface Technology ,,Dynamic Roller Temperature Control]," Oberflächentechnik (2005).

Michaeli, Walter et al., "Prägen mikrostrukturierter Kunststofffolien," Oberflächentechnik, Kunststoffe, Mar. 2006.

Müller, Andreas K., "Werkzeug- und Prozesstechnik zur Abformung von Nanostrukturen auf Kunststoffsubstraten im Spritzgießverfahren [Tool and processing technologies for molding nanostructures on plastics substrates by injection molding]," Karlsruher Institut für Technologie (2006).

Baac, Hyoungwon et al., "Submicron-scale topographical control of cell growth using holographic surface relief grating," Materials Science and Engineering C 24, 209-212 (2004).

Brunette, D. M. et al., "Grooved Titanium Surfaces Orient Growth and Migration of Cells from Human Gingival Explants," Journal of Dental Research 62(10), 1045-1048 (Oct. 1983).

Clark, Peter et al., "Cell guidance by micropatterned adhesiveness in vitro," Journal of Cell Science 103, 287-292 (1992).

Dalby, Matthew J. et al., "Investigating filopodia sensing using arrays of defined nano-pits down to 35 nm diameter in size," International Journal of Biochemistry & Cell Biology 36, 2005-2015 (2004).

Entcheva, Emilia et al., "Acoustic micromachining of three-dimensional surfaces for biological applications," The Royal Society of Chemistry, Lab Chip 5, 179-183 (2005).

Gadegaard, Nikolaj et al., "Nano patterned surfaces for biomaterial applications," Advances in Science and Technology 53, 107-115 (2006).

Kuhn, Sascha, "Molding of micro- and nanostructured plastic parts," Mikro-Nano-Integration, Mar. 12-13, 2009, Seeheim, Germany.

Lee, Hyun Sup et al., "Replication of nanostructures on microstructures by intermediate film mold inserted hot embossing process," Microsyst. Technol. 14, 1149-1155 (Mar. 5, 2008).

Lee, Woo et al., "Non-litographic Approach to the Fabrication of Polymeric Nanostructures with a Close-Packed 2D Hexagonal Array," Advanced Materials 14, No. 17, 1187-1190 (Sep. 3, 2002).

(56) References Cited

OTHER PUBLICATIONS

Pranov, Henrik et al., "On the Injection Molding of Nanostructured Polymer Surfaces," Polymer Engineering and Science 46, 160-171 (2006).

Schift, Helmut, "Nanoimprint litography: An old story in modern times? A review," Journal of Vacuum Science & Technology B 26, 458-480 (Mar.-Apr. 2008).

Studer, V. et al., "Nanoembossing of thermoplastic polymers for microfluidic applications," Applied Physics Letters 80, 3614-3616 (May 13, 2002).

Truckenmüller, R. et al., "Flexible fluidic microchips based on thermoformed and locally modified thin polymer films," The Royal Society of Chemistry, Lab Chip 8, 1570-1579 (Jul. 24, 2008).

Turner, S. et al., "Cell attachment on silicon nanostructures," Journal of Vacuum Science & Technology B 15(6), 2848-2854 (Nov./Dec. 1997).

Wei, Wei et al., "Demonstration of Nano-structures using Wedge-Molding Process," IEEE, 789-792 (2003).

Lee, Hyun Sup et al., "Replication of nanostructures on microstructures by intermediate film mold inserted hot embossing process," Microsyst. Technol. 14:1149-1155 (2008).

International Search Report dated Nov. 17, 2015 (PCT/EP2015/062238).

\* cited by examiner

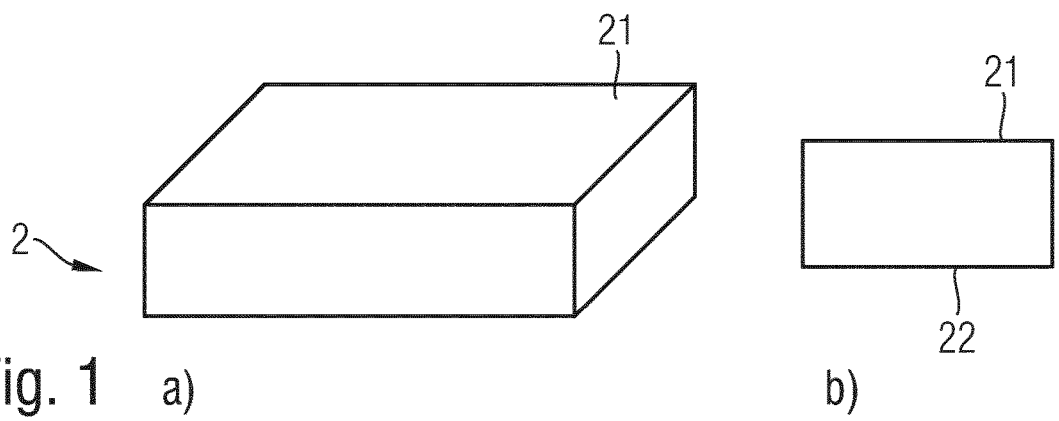
Fig. 1  a)   b)
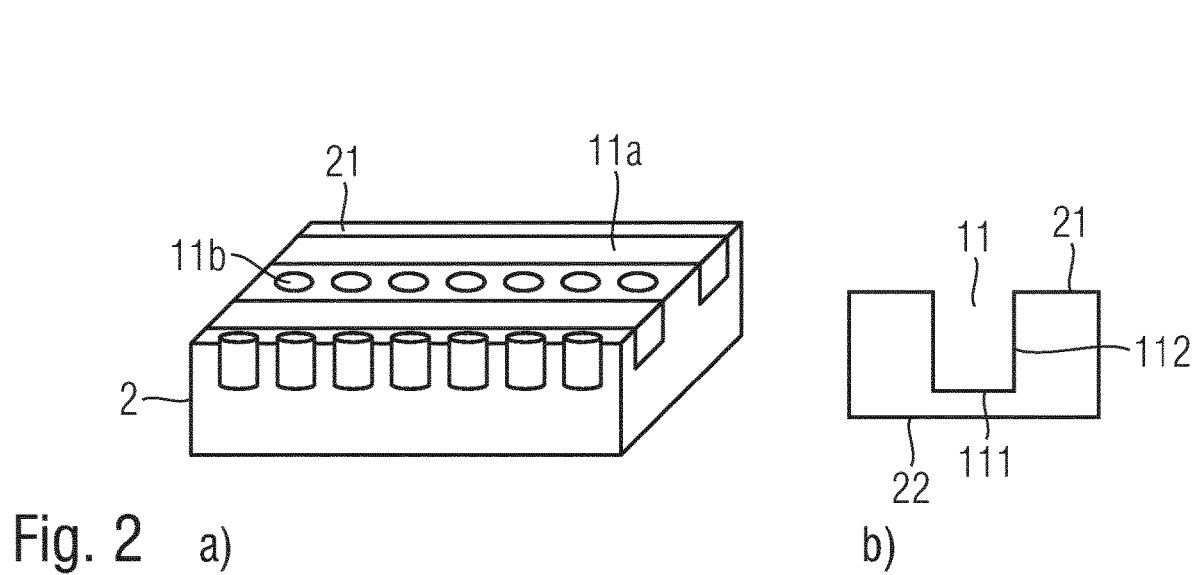
Fig. 2  a)   b)
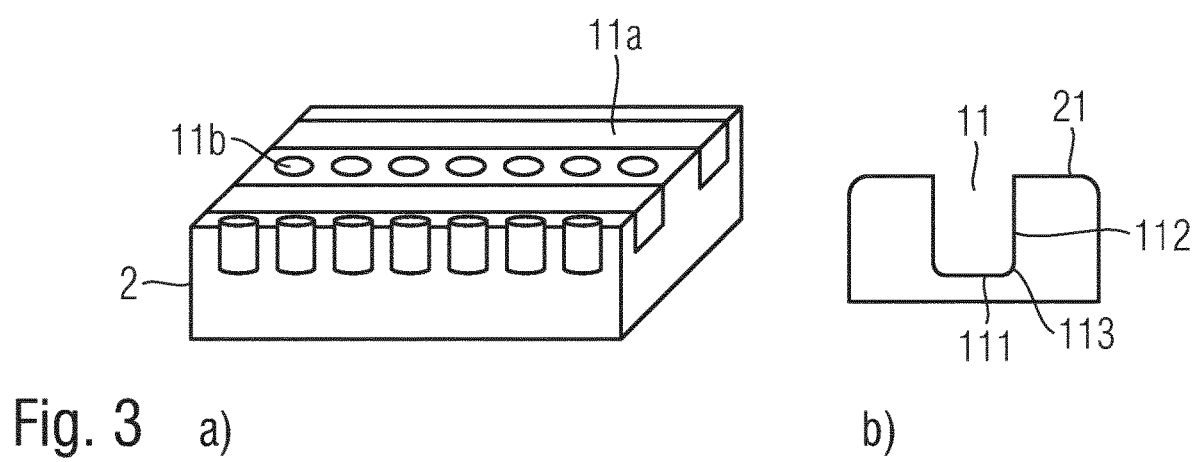
Fig. 3  a)   b)

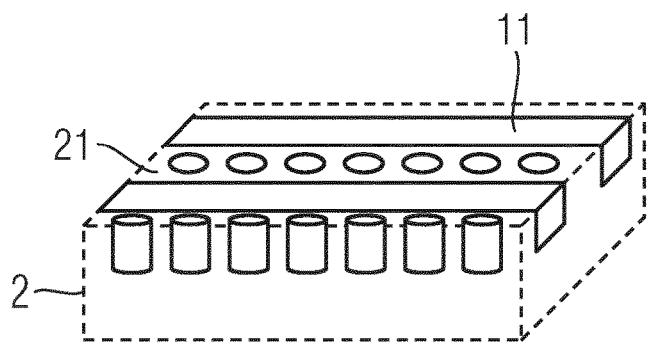
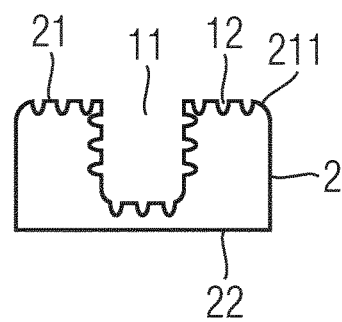
Fig. 4  a)    b)
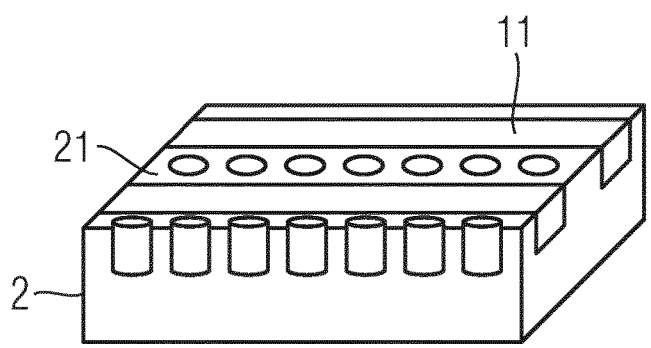
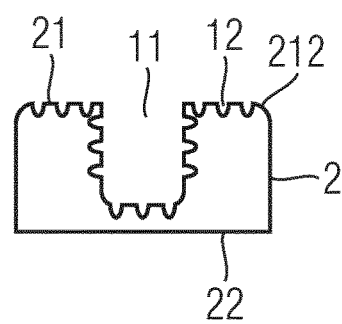
Fig. 5  a)    b)
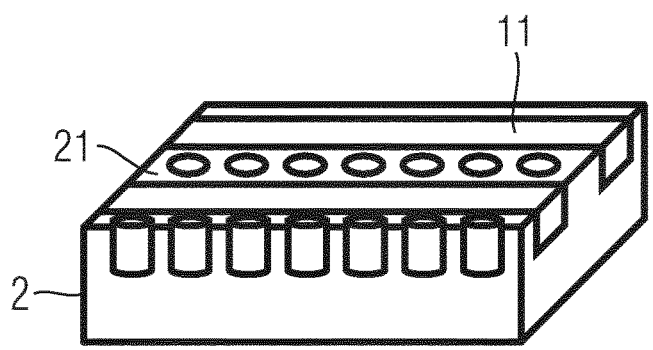
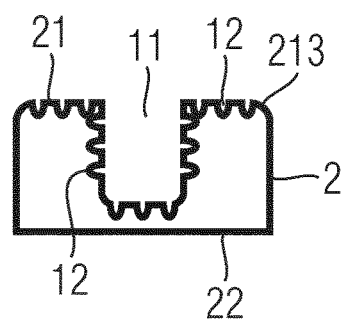
Fig. 6  a)    b)

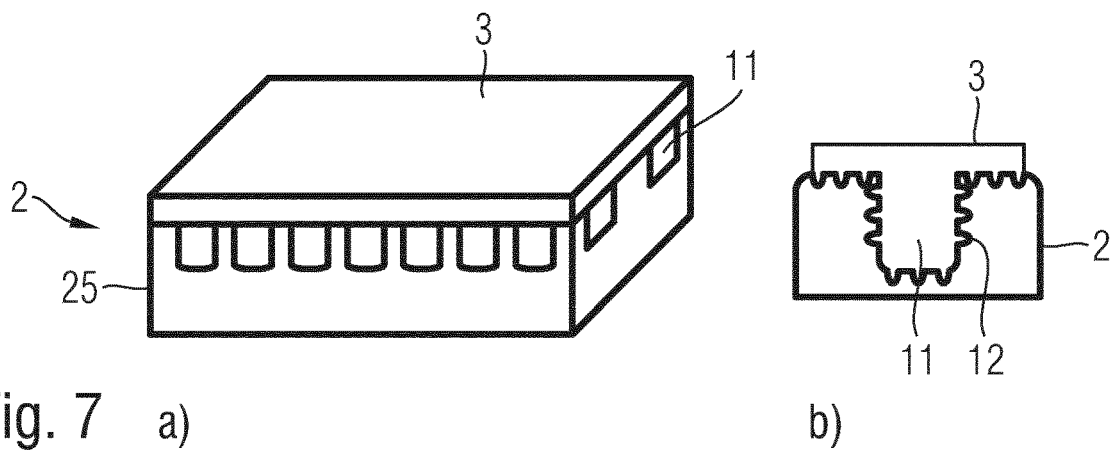
Fig. 7  a)                b)
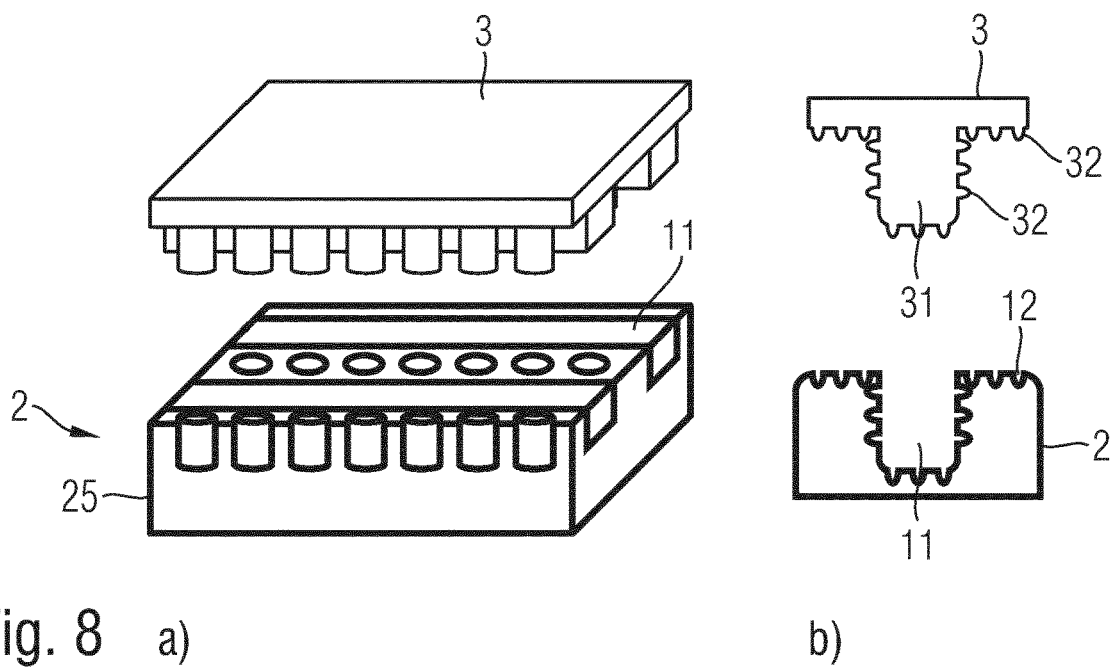
Fig. 8  a)                b)
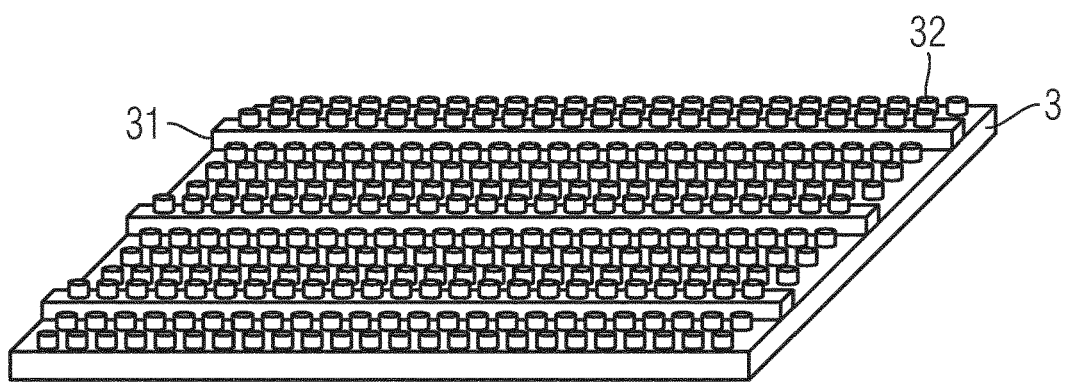
Fig. 9

MOLD, METHOD FOR THE PRODUCTION AND USE THEREOF, PLASTIC FILM AND PLASTIC COMPONENT

FIELD OF THE DISCLOSURE

The invention relates to a method for producing a surface structure on a molding tool, wherein first structural elements are generated by means of laser structuring in a first method step. The invention also relates to a method for hot stamping a plastic film, in which at least the surface of the plastic film is provided with a dye, at least part of the plastic film is heated above a deformation temperature by the absorption of electromagnetic radiation and is subsequently molded by means of a molding tool. The invention also relates to a molding tool having a surface structure, which has first structural elements that have a lateral expansion between about 0.5 µm and about 500 µm. Such plastic components can be produced by means of the so-called molding tool.

BACKGROUND

Plastic films and molding tools for structuring the same are known from U.S. Pat. No. 8,021,628 B2. The employed molding tool has an approximately cylindrical basic form, the lateral surface being provided with a structure. If a polymer melt or a film heated to softening contacts the tool, a form complementary to the structure of the tool is stamped into the surface of the plastic material.

However, the molding tool and the resulting plastic components have the drawback that very small surface structures of less than 1 µm or less than 100 nm cannot be produced.

SUMMARY

Proceeding from the prior art, the object of the invention is therefore to provide a plastic film and/or a plastic component, a molding tool and a method for the production thereof, which have both first structural elements and second structural elements, the second structural elements having a smaller lateral expansion and/or a lower depth than the first structural elements.

The invention proposes a method for producing a molding tool, by means of which the surface structure and thus the negative form of the desired surface structure of the finished component is produced in a two-stage method. In the first method step, first structural elements having a comparatively large lateral extension and/or depth are produced. Then, second structural elements are produced in a second method step and have a lower depth and/or a smaller lateral extension. Therefore, the second structural elements cover the boundary surfaces of the first structural elements.

In some embodiments of the invention, the surface of the first structural elements can be fully covered with second structural elements, in particular also perpendicular or almost perpendicular surface regions. Due to this combination of a microstructure and a nanostructure it is possible to provide plastic films or plastic components having an enlarged effective surface area. In some embodiments of the invention, the surface area can be increased by a factor of about 10 to a factor of about 500 above the area defined by the macroscopic dimensions of the plastic component. In some embodiments of the invention, the plastic films structured according to the invention can be used for improved materials in order to colonize cells. In some embodiments of the invention, the biocompatibility of implants with the surfaces structured according to the invention can be improved. In still other embodiments of the invention, the surface structure can be used for the delayed active substance release of pharmaceutical active substances. In these cases, the component according to the invention can be, or contain, an active substance carrier.

In some embodiments of the invention, the first structural elements can be produced by laser structuring. In some embodiments of the invention, the laser structuring can be carried out by means of short-pulse lasers which have a pulse duration of less than 100 nanoseconds, less than 25 nanoseconds or less than 100 femtoseconds. Due to non-linear optical and thermal effects, such short-pulse lasers lead to a removal of material which can be controlled with great accuracy by pulse duration, pulse form, wavelength, power and number of individual pulses and duration of the pulse sequence periods. In other embodiments of the invention, it is also possible to produce first structural elements by means of photolithography or by machining, e.g. by milling or grinding.

In a further method step, second structural elements are produced which have a smaller lateral expansion and/or a low depth in comparison with the first structural elements. In some embodiments of the invention, the second structural elements can be smaller by a factor of at least 10 than the first structural elements in at least one spatial direction. In other embodiments of the invention, second structural elements can have an expansion that is smaller by a factor 100 or a factor of 1000 in at least one spatial direction.

In some embodiments of the invention, the second structural elements can be produced by anodic oxidation. In the anodic oxidation, the molding tool is connected as the anode and immersed into an acidic electrolyte, as a result of which an oxide layer is formed on the surface of the anode.

In some embodiments of the invention, a polyprotic acid can be used as an electrolyte. In some embodiments of the invention, the polyprotic acid can be selected from sulfuric acid and/or oxalic acid and/or phosphoric acid. The thus produced oxide layer is nanoporous and has pores oriented perpendicularly in relation to the surface. The pores can be arranged in hexagonal fashion. Here, the pore distance, the pore diameter and the pore depth can be influenced by the process parameters of the anodic oxidation. In some embodiments, the pore size is determined by the applied voltage, the kind of electrolyte, the concentration of the electrolyte and the temperature of the electrolyte. The depth of the nanopores can be influenced by the time of the anodic oxidation. In some embodiments of the invention, the pores produced by the anodic oxidation can be smaller by a factor of about 10, a factor of about 100 or a factor of about 1000 as compared to the lateral expansion of the first structural elements.

In some embodiments of the invention, the first structural elements can have a lateral expansion of about 0.5 µm and about 500 µm. In other embodiments of the invention, the first structural elements can have a lateral expansion of about 10 µm to about 100 µm. In still another embodiment, the first structural elements can have a lateral expansion of about 15 µm to about 25 µm. In this way, living cells can be embedded in the intermediate spaces between adjacent structural elements, as a result of which such a structured plastic film and/or such a plastic component can be used as a cell culture substrate, as an active substance carrier or as an implant material.

In some embodiments of the invention, the first structural elements can have a height of about 0.5 to about 50 µm. In other embodiments of the invention, the first structural elements can have a height of about 1 µm to about 10 µm.

In still other embodiments of the invention, the first structural elements can have a height of about 5 µm to about 200 µm.

In some embodiments of the invention, the molding tool can contain, or consist of, at least one metal or at least one alloy. This material can readily be provided with first structural elements by both machining and laser material processing. On account of the good electric conductivity, a metallic material is also particularly well suitable for an anodic oxidation in an acidic electrolyte.

In some embodiments of the invention, the molding tool can contain, or consist of, aluminum and/or titanium. Both materials can be provided with an oxide layer in a particularly easy fashion by means of anodic oxidation, said oxide layer containing pores and thus providing the second structural elements according to the invention. At the same time, the oxidized surface of these metals is almost chemically inert and sufficiently hard, as a result of which the molding tool is only exposed to minor wear during the forming operation.

In some embodiments of the invention, the anodic oxidation can be carried out to produce the second structural elements in a multi-stage method. In some embodiments of the invention, a multi-stage method can contain the following steps: at least one first anodic oxidation, the at least partial removal of an oxide layer by wet chemical etching and at least one second anodic oxidation. In some embodiments, the first anodic oxidation can take between 2 hours and about 6 hours. Due to the partial removal of the oxide layer, the surface of the molding tool maintains the impression of the hexagonally arranged, semi-spherical pore bottoms. These regular recesses in the surface of the molding tool serve as a mask for the formation of pores in the second anodic oxidation. In some embodiments of the invention, the second anodic oxidation can take place under the same conditions as the first anodic oxidation. This method permits a highly ordered structure having a very narrow distribution, i.e. the second structural elements are arranged on the surface of the first structural elements with only minor intermediate spaces.

In some embodiments of the invention, the pores of the oxide layer can be opened further after the conclusion of the anodic oxidation by wet or dry chemical etching in order to ensure greater porosity. This leads to a denser arrangement of second structural elements which render possible a further increase in the surface area of the plastic film and/or the component. In some embodiments of the invention, the nanopores of the second structural elements can be used as an active substance depot for pharmaceutical active substances or active substance combinations, as a result of which active substances or nutrients can be released directly to the embedded cells when the structured component is used as a cell culture substrate.

In some embodiments of the invention, the surface area can optionally be smoothened by electropolishing between the production of the first structural elements and the production of the second structural elements. In other embodiments of the invention, plasma polishing can be carried out alternatively or additionally with respect to the electropolishing operation. The electropolishing operation lowers the microroughness of the metallic surface of the molding tool. Due to the field enhancement, roughness tips are faster removed than roughness troughs, and therefore a reflective surface or reflective subareas can form on the molding tool. Edges and corners are also removed more strongly on account of the field enhancement, which effects a very fine deburring of the first structural elements. The first structural elements per se remain unaffected by electropolishing as they are relatively large structures. As a result, the first structural elements remain substantially unmodified by this method step.

In some embodiments of the invention, the molding tool can be tempered after producing the second structural elements. In some embodiments of the invention, the tempering operation can be carried out at a temperature of about 80° C. to about 1300° C. In some embodiments of the invention, the tempering operation can be carried out in an oxidizing atmosphere to reinforce the oxide layer resulting from anodic oxidation and/or to further oxidize optionally available hydroxide compounds. In still other embodiments of the invention, the tempering operation can be carried out in a protective gas atmosphere, e.g. nitrogen or argon, as a result of which the oxide layer is not further built up.

In some embodiments of the invention, $\gamma$-aluminum oxide can be converted into $\alpha$-aluminum oxide during tempering. This serves to increase the hardness of the oxide layer on the surface of the molding tool, as a result of which the service life of the molding tool can be prolonged when the plastic parts are structured.

In some embodiments of the invention, a non-stick coating can be produced on the surface of the molding tool after producing the second structural elements. The non-stick coating can have a lower surface energy, thus reducing the sticking of the plastic material to be structured to the molding tool. In some embodiments of the invention, the non-stick coating can be produced by means of plasma enhanced chemical vapor deposition (PE-CVD). The plasma can be produced e.g. by RF or microwave radiation. Gaseous precursors are excited and/or dissociated in the plasma and the latter can polymerize on the surface of the molding tool for the desired coating.

The precursors for producing the non-stick coating can contain organosilicon monomers and/or perfluorinated hydrocarbons. In some embodiments of the invention, hydrocarbons, such as benzene or methane, can be used. In some embodiments of the invention, hexamethyldisilazane can be used as a precursor. In addition, the precursor can contain carrier gases and/or dopants.

In some embodiments, the non-stick coating can have a thickness of about 5 nm to about 30 nm. Such a thin non-stick coating can abut in positive engagement on the surface of the first and second structural elements, as a result of which in particular the pores of the second structural elements are not leveled and/or filled by the non-stick coating. Nevertheless such a thin coating is sufficient to prevent, or at least reduce, such a sticking of the softened plastic composition to the molding tool.

In some embodiments of the invention, it relates to a method for hot stamping a plastic film where at least the surface of the plastic film is provided with a dye. At least part of the plastic film can be heated above the deformation temperature and then be molded by means of a molding tool by irradiating the plastic film with electromagnetic radiation, the wavelength of which is adapted to an absorption band of the dye.

According to the invention, it is now proposed that the dye contains nanoparticles which include at least one metal or one alloy from a plurality of metals. Compared to other, generally known nanoparticles, the nanoparticles proposed according to the invention have the advantage that a minor surface density of the plastic film is sufficient to heat the material. As a result, it is possible to largely avoid chemical modifications on the surface by the dye coating.

The nanoparticles show the effect of the plasmon excitation. This is a collective oscillation of the conduction band electrons of a nanoparticle. The spectral position of the plasmon resonance is determined by the material of the nanoparticles, the material of the plastic film and/or the plastic component and the particle size and/or the particle form and/or the position of the particles in relation to the irradiation direction of the excitation radiation. The nanoparticles are heated via the electron-phonon coupling and dissipate this heat to the plastic material. In some embodiments of the invention, the nanoparticles can contain, or consist of, gold or silver.

In some embodiments of the invention, the deformation temperature can be selected from the glass transition temperature or the melting temperature or a temperature which is selected in such a way that it is lower than the melting temperature by a predeterminable amount. In some embodiments of the invention, the temperature can be 30 K or 50 K or 70 K below the melting temperature.

In some embodiments of the invention, the nanoparticles are arranged on the plastic film in such a way that they are separated from one another. It has been realized according to the invention that a single monolayer or fractions of a monolayer are sufficient to heat at least one near-surface region of the plastic film above the deformation temperature such that it can subsequently be molded in contact with the molding tool. If the molding tool has the above described surface structure including first structural elements and second structural elements, the plastic film and/or the plastic component can also be provided with such a structure during hot stamping.

In some embodiments of the invention, the electromagnetic radiation can be selected from the visible spectral range. This permits a particularly simple optical control of the heating process. In addition, visible light can be produced in a particularly simple way, e.g. by halogen lamps or arc lamps.

In some embodiments of the invention, the nanoparticles can be applied onto the plastic film by a PVD method. The PVD method can be selected from sputtering, evaporation or ion-supported metal deposition. These methods permit a precise control of the surface density of the surface of the plastic film. In addition, the coagulation and coalescence of the nanoparticles are avoided when the deposition is carried out in a vacuum, as a result of which no agglomerates are formed on the surface of the plastic film. Such agglomerates have a deviating absorption behavior, as a result of which a uniform heating cannot be guaranteed.

In some embodiments of the method, the ratio of the size of a nanoparticle to the wavelength of the electromagnetic radiation used for heating can be e.g. about 0.1 to about 1. Therefore, the nanoparticles are usually smaller than the wavelength of the electromagnetic radiation used for heating. This serves to ensure an efficient excitation of the surface plasmons on the nanoparticles.

In some embodiments of the invention, the optical transmission of the plastic film can be measured during heating and/or molding. It has turned out that by heating the plastic film by means of absorption of electromagnetic radiation at the nanoparticles a change in the size and/or form of the nanoparticles occurs by coalescence and recrystallization and/or that nanoparticles which have an ellipsoidal form can be realigned by thermal movements of the polymer chains. This leads to a change in the size of the nanoparticles and/or the form of the nanoparticles. As a result, the spectral position of the plasmon resonance is shifted and thus the absorption maximum is shifted. In some embodiments of the invention, the supply of heating energy can thus be automatically reduced when the plastic film surface has been heated sufficiently. At the same time, the time of sufficient heating can be recognized by detecting the absorption maximum, and therefore a simple process control of the hot stamping method is rendered possible.

In some embodiments of the invention, there can be a visible colored change in the film upon heating. For example, the plastic film can lose a translucent coloration and can become optically transparent when heated because the nanoparticles are no longer arranged in one plane altogether. Therefore, hot stamped films can be easily distinguished from non-hot stamped films, as a result of which unintended confusion of semi-finished products and finished products can be avoided. Furthermore, the method can be used in spite of the dye also for products, the optical properties of which are essential to the function. Such products could not be produced with the formerly used dyes due to the coloration remaining permanently in the end product.

In some embodiments of the invention, the plastic film can contain at least one first layer and at least one second layer, the first layer containing a polymer having a higher density and/or a higher deformation temperature and the second layer containing a polymer having a lower density and/or a lower deformation temperature. In some embodiments of the invention, the first layer can contain ultrahigh molecular weight polyethylene (UHMW-PE) and/or polyether ether ketone (PEEK) and/or polyethylene terephthalate (PET) and/or polyamide (PA). In some embodiments of the invention, the second layer can contain polyethylene (PE) and/or high density polyethylene (HD-PE) and/or low density polyethylene (LD-PE) and/or polystyrene (PS) and/or polypropylene (PP) and/or at least one fluoropolymer. The first layer and the second layer can be joined to one another by lamination or welding. As a result, plastic films having a structured surface can also be provided which consist substantially of a material that is not accessible to molding by hot stamping. As a result, material having higher tear strength or higher thermal resistance can be provided which is still provided with the surface structure according to the invention.

In some embodiments of the invention, the nanoparticles can contain gold and/or silver. These nanoparticles have a particularly good light absorption and thus show efficient heating. On account of their germ-killing or germ-inactivating effect, nanoparticles made of silver can also be used for microbiologically sensitive applications. The occurrence of undesired infections can thus be reduced.

In some embodiments of the invention, a plastic film can contain at least one first layer and at least two second layers, the first layer containing a polymer having a greater hardness and/or a higher molding temperature and the second layers containing a polymer having a lower hardness and/or a lower deformation temperature, the second layers being arranged on both sides of the first layer. In this way, a film can have a high mechanical strength and at the same time be provided in a simple way on both sides with the structured surface according to the invention.

BRIEF DESCRIPTION OF THE DRAWINGS

The invention shall be specified below by means of drawings without confining the general inventive concept, wherein FIG. 1 shows part of a molding tool without surface structure.

FIG. 2 shows part of a molding tool having first structural elements.

FIG. 3 shows part of a molding tool after the electropolishing operation.

FIG. 4 shows part of a molding tool after the production of second structural elements.

FIG. 5 shows part of a molding tool after the stabilization of the second structural elements.

FIG. 6 shows part of a molding tool after the application of a non-stick coating.

FIG. 7 shows by way of example the application of a molding tool in a first method step of an injection molding method.

FIG. 8 shows by way of example the use of the molding tool in a second method step of an injection molding method.

FIG. 9 shows by way of example a plastic component or a plastic film according to a first embodiment of the invention.

DETAILED DESCRIPTION

Figure 10:
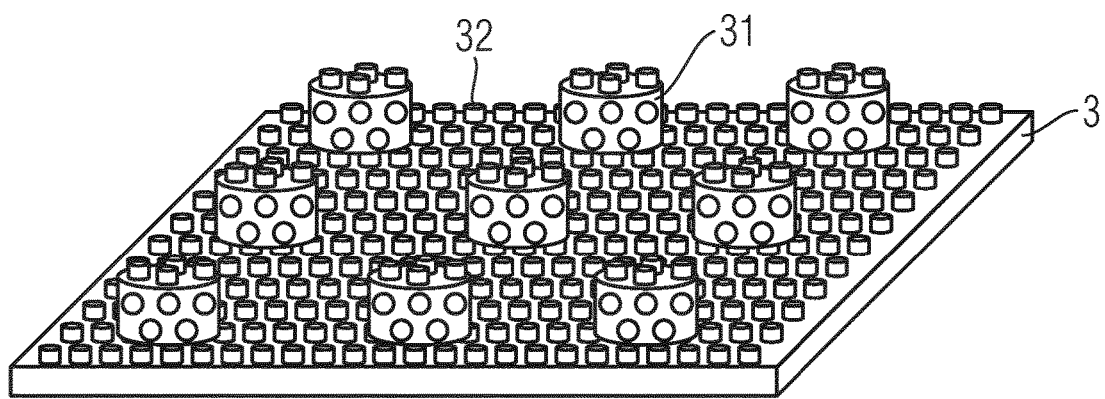
FIG. 10 shows by way of example a plastic film or a plastic component according to a second embodiment of the invention.

The method according to the invention, which is used to produce a molding tool, is explained by means of FIGS. 1 to 6. FIGS. 1a, 2a, 3a, 4a, 5a and 6a each show an axonometric view. FIGS. 1b, 2b, 3b, 4b, 5b and 6b show a cross-section through the molding tool.

The basic substrate of the molding tool 2 is provided in the first method step. The basic substrate can contain a metal or an alloy. In some embodiments of the invention, the basic substrate can contain aluminum or titanium. These materials can easily be processed and also form a stable oxide layer on the surface thereof, which due to their hardness guarantee low abrasive wear of the molding tool and are chemically inert to a large extent.

The described embodiment uses an approximately rectangular initial substrate having a first side 21 and an opposite second side 22. In other embodiments of the invention, the substrate can have another basic form. In particular, an approximately cylindrical molding tool can be used for continuous hot stamp processes.

FIG. 2 shows the molding tool after carrying out a first method step, in which first structural elements 11A and 11B are produced. The first structural elements can be made e.g. by laser structuring. Here, the laser radiation effects the removal of material such that e.g. a groove 11A or a plurality of bores 11B can be produced on the first side 21 of the molding tool 2. In other embodiments of the invention, the first structural elements can have a different form. However, the invention is specified in the below figures by way of example by means of a groove 11A as a first structural element 11. The form of the first structural elements 11 can be selected in accordance with the desired intended use of the structured plastic components, as a result of which e.g. cells can be embedded between the first structural elements 11.

The first structural elements can have a lateral resolution of about 0.5 µm to about 500 µm or of about 10 µm up to about 100 µm. As evident in FIG. 2B, a groove 11 as an exemplary first structural element has two opposite confining surfaces 112 which extend approximately perpendicularly to the first side 21 and are arranged in parallel to one another. The base of the structural element 11 forms the bottom area 111, which extends approximately parallel to the first side 21 and to the second side 22. After the production of the first structural elements, the boundary edges between the areas 112 and the first side 21 as well as between the areas 112 and the area 111 can be comparatively sharp-edged or have a burr.

FIG. 3 shows the molding tool after an optional electropolishing operation. In the electropolishing operation, an electric DC or AC voltage is applied to the molding tool 2 in an acidic electrolyte. Prior to the electropolishing operation, an optional purification step can be carried out to provide a fat-free surface of the molding tool 2. This can lead to a more uniform effect of the electropolishing operation.

Since an electric field enhancement occurs at the component edges or tips, the effect of the electropolishing operation is more intense along the edges and burrs than along the flat areas. As a result, the surface of the first structural elements 11 and/or of the first side 21 is smoothened since protruding subareas of the boundary surfaces are subject to greater removal resulting from the electropolishing operation. Furthermore, edges can be deburred or rounded, as shown by way of example along the transition 113 between the boundary surfaces 111 and 112 of the first structural element 11. Such a rounded form can be advantageous when the molding tool is cast since the soft plastic mass can penetrate more easily such rounded structures in order to completely fill them.

The period of the electropolishing operation and the removal rate are selected in such a way that undesired burrs and roughness are removed while the first structural elements 11 are maintained in the desired form.

FIG. 4 shows the molding tool 2 after the production of the second structural elements 12. In the shown embodiment, the second structural elements 12 comprise pores which cover the entire first side 21 and all boundary surfaces of the first structural elements 11. The pores 21 can be arranged in a hexagonally dense arrangement on the first side 21 of the molding tool 2.

In the shown embodiment, the pores 21 are produced by anodic oxidation of the molding tool 2. In some embodiments of the invention, the anodic oxidation can take place in a polyprotic acid, as a result of which an oxide layer is formed on the first side 21 and the first structural elements 11. The oxide layer has an intrinsic porosity which can optionally be opened further by selective etching to provide the shown open second structural elements.

If aluminum or an aluminum alloy was chosen for the molding tool 2, a layer 211 is formed during the anodic oxidation and contains aluminum oxide. Due to this, the molding tool 2 is protected against further corrosive attack. On account of the greater hardness of the oxide in comparison with the pure metal, the abrasive wear can also be reduced during casting. In some embodiments of the invention, the second structural elements 12 can have a lateral expansion and/or a depth which is smaller by a factor of at least 10 than the lateral expansion and/or the depth of the first structural elements 11. As a result, the surface of the molding tool and thus the surface of the cast component can be enlarged, e.g. to provide an active substance carrier for pharmaceutical active substances or a cell culture substrate.

The further optional method steps shown in FIGS. 5 and 6 serve to further improve the stability of the molding tool and/or to improve the product quality of the plastic component produced by means of the molding tool 2.

In method step 5, the molding tool can be tempered. In some embodiments of the invention, this can be done at a temperature between about 800° and about 1300°. A protective gas atmosphere can optionally be applied to prevent a further oxidation of the first side 21 of the molding tool 2. The temperature treatment of the molding tool 2 can effect that γ-aluminum oxide is converted into α-aluminum oxide. The α-aluminum oxide 212 can have a greater mechanical stability and/or an increased resistance to solvents, acids and/or lyes.

FIG. 6 shows the molding tool according to a further optional method step, namely the deposition of a non-stick coating 213. The non-stick coating 213 can have a lower surface energy, as a result of which the sticking of heated and thus flowable plastic mass is reduced and thus the casting of the finished plastic component is facilitated.

In some embodiments of the invention, the non-stick coating 213 can contain, or consist of, a plasma polymer which can be obtained by depositing gaseous precursors from the gas phase. The non-stick coating 213 can contain, or consist of, an organosilicon or organofluorine compound. Such coatings can be obtained e.g. from the polymerization of hexamethyldisilazane or perfluorinated hydrocarbons.

The non-stick coating can have a mean layer thickness of less than 10 nm, such that it fully covers both the first structural elements 11 and the second structural elements 12 without completely filling the structural elements and thus preventing the molding in particular of the second structural elements 12.

An injection molding method using the molding tool according to the invention is explained by means of FIGS. 7 and 8. Here FIG. 7a and FIG. 8a show an axonometric representation of the molding tool and of the plastic component. FIGS. 7b and 8b both show a cross-section through the molding tool 2 and the thus produced plastic component 3.

The molding tool 2 produced by means of the above described method can be inserted in a generally known injection molding machine. As a result, it is possible to produce plastic components having a total mass of less than 1 mg up to more than 10 kg with cycle times of some few seconds up to several minutes. For this purpose, the plastic granules are melted in generally known manner by a rotating and heated conveyor and conveyed under pressure into the injection molded form.

FIG. 7 shows how the plastic component and/or the plastic material heated above the molding temperature fills the cavities of the molding tool 2. Here, the plastic material penetrates both the first structural elements 11 and the second structural elements 12. The filling degree can be influenced via the viscosity of the liquefied raw material and the process pressure. A minor shrinkage of the plastic material during cooling can facilitate the removal of the component 3 from the molding tool 2.

FIG. 8 shows the process of removal. Here the plastic component 3 is separated from the molding tool 2. It is clear in particular from FIG. 8b that the plastic component 3 has a first structural element 31 which has been shaped by first structural elements 11 of the molding tool 2. The first structural element 31 is covered by a plurality of second structural elements 32 which were formed by the second structural elements 12 of the molding tool 2. Therefore, the plastic component and/or the plastic film 3 is both microstructured and nanostructured.

FIG. 9 shows a first embodiment of a plastic component 3. The plastic component 3 has substantially the basic shape of a plane-parallel plate, the surface of which is provided with first structural elements 31 in the form of ribs which run over the entire longitudinal extension of the plastic component 3. The entire surface is provided with second structural elements 32 and has an approximately cylindrical basic form. The second structural elements 32 also cover the first structural elements 31 such that the plastic component 3 is both microstructured and nanostructured.

FIG. 10 shows a second embodiment of a plastic component 3 according to the invention. The plastic component 3 according to the second embodiment also has first structural elements 31. In the described embodiment, the first structural elements 31 are arranged in approximately cylindrical fashion and in a uniform grid on the surface of the plastic component 3.

The entire surface of the plastic component 3 is covered by second structural elements 32, which also have an approximately cylindrical basic form. However, the second structural elements 32 are considerably smaller, i.e. by a factor of at least 10. They also cover the perpendicular surface areas of the first structural elements 31, thus taking care of an efficient enlargement of the surface of the plastic component and/or the plastic film 3.

Figure 11:
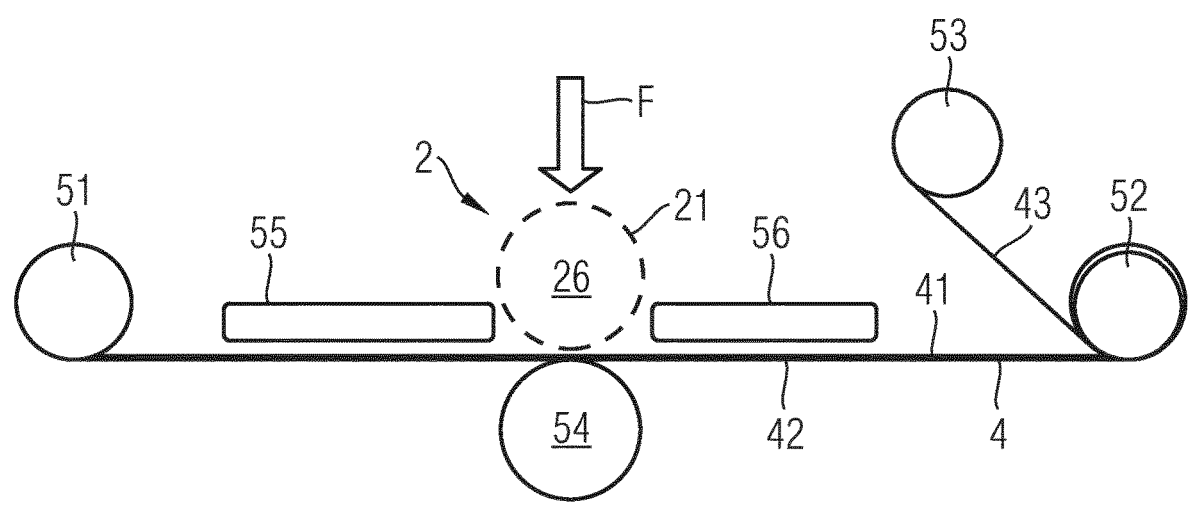
FIG. 11 shows a device for hot stamping according to the present invention.

FIG. 11 explains a device for carrying out a hot stamp process, by means of which a film web 4 can be provided continuously with a surface structure, e.g. with the structure shown in FIG. 9 or FIG. 10. For this purpose, the unstructured film web 4 is unwound from a first feed drum 51. Then, the film web 4 passes through a heating element 55, which heats at least the first side 41. The heat input can here be controlled in such a way that the second side 42 is not heated above the deformation temperature to ensure the mechanical stability of the film web 4 during the hot stamp method. However, the first side 41 is heated above the deformation temperature to render possible the plastic deformation by the molding tool 2.

For this purpose, the heating device 55 can emit electromagnetic radiation, e.g. in the infrared spectral range, in the visible spectral range or in the ultraviolet spectral range. The film web 4 can be provided with a dye, as explained below by means of FIGS. 12 to 14. As a result, a selective heating of the first side 41 becomes possible, and therefore thin films 4 having a thickness of about 10 μm to about 125 μm can also be structured in the hot stamp method without being damaged by excessive heat input.

The film web heated by the heating device 55 passes through the molding tool 2, which has the form of a cylindrical roll 26. The lateral surface 21 of the cylindrical roll 26 is provided with the structure according to the invention which has both first structural elements and second structural elements, the second structural elements being smaller than the first structural elements. The cylindrical roll 26 can optionally also be provided with an oxide layer and/or a non-stick layer, as explained above by means of FIGS. 5 and 6, in order to reduce the sticking of the plastic mass or to increase the service life of the molding tool.

In order to apply the stamp forces required for molding, a mating roll 54 can be arranged opposite the molding tool 2. The mating roll 54 can have a smooth surface in order to avoid damage and/or undesired molding of the second side 42 of the film web 4 or can optionally have the same or also another surface structured according to the method of the invention in order to be able to carry out the structuring on both sides.

If the film web 4 already cools down in contact with the molding tool 2, the resulting shrinkage can facilitate the removal of the film web 4 from the molding tool 2.

After the hot stamp process with the molding tool 2, the film web 4 can optionally pass through a cooling device 56 in order to render possible a rapid solidification below the deformation temperature and thus a mechanical stabilization of the microstructure.

Following microstructuring and cooling, the plastic film 4 can be wound onto a second feed drum 52. In order to avoid the damage of the structure, an optional protective film 43 can be applied which is unwound from a third feed drum 53 and is wound onto the second feed drum 52 together with the plastic film 4.

Figure 12:
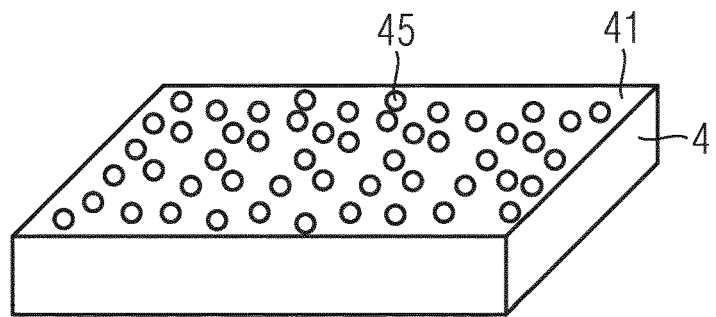
FIG. 12 shows the first method step of a hot stamping method according to the invention in a first embodiment.
Figure 13:
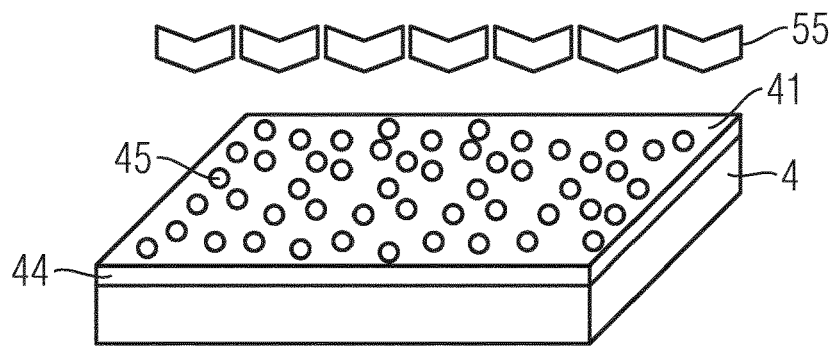
FIG. 13 shows the second method step of a hot stamping method according to the invention in a first embodiment.
Figure 14:
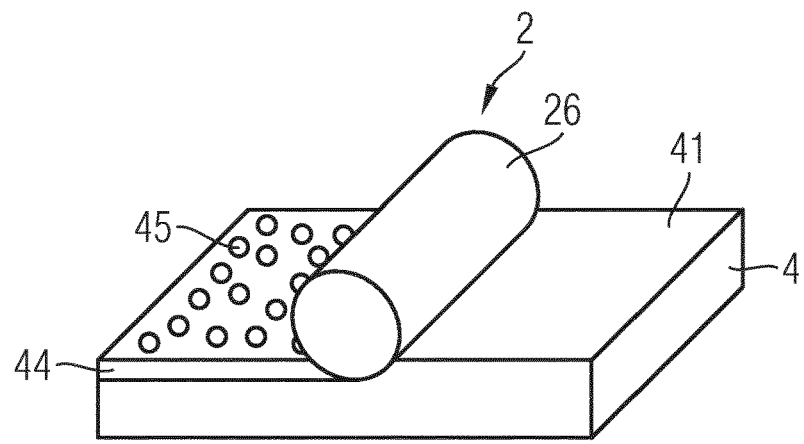
FIG. 14 shows the third method step of a hot stamping method according to the invention in a first embodiment.

A process control is explained by means of FIGS. 12, 13 and 14 and permits the selective heating of the first side 41 of a plastic film 4. For this purpose, the plastic film 4 is coated with nanoparticles 45. The nanoparticles 45 have a size which is smaller than the wavelength of the electromagnetic radiation used for heating. As a result, plasmon resonances can be excited on the surface of the nanoparticles 45 which heat the nanoparticles and then heat the plastic film 4.

Since the nanoparticles 45 are only applied to the first side 41 of the plastic film 4, the heat proceeds from the first side 41 and penetrates the depth of the plastic film 4 as shown schematically by means of FIG. 13. As a result, a layer 44 bordering on the first side 41 is formed and is heated above the deformation temperature on account of the electromagnetic radiation emitted by the heating device 55. Due to this, the first side 41 can be plastically deformed and be provided with the microstructure and nanostructure according to the invention. At the same time, the opposite side of the plastic film and/or deeper layers in the volume of the film does not heat above the deformation temperature, and therefore the mechanical stability thereof is maintained during the stamp process and ensures a safe stripping of the plastic film.

According to the invention, it was found that as a result of the application of the nanoparticles 45 by means of a PVD method, individual nanoparticles 45 are arranged on the surface 41 in such a way that they are spaced apart. This serves to avoid the occurrence of agglomerates, as a result of which the plasmon resonance makes possible a light absorption in part of the electromagnetic spectrum. Light of different wavelength can penetrate the plastic film 4 without providing the plastic film 4 with an essential amount of thermal energy, thus confining the heating to the layer 44 bordering on the first side 41.

As shown in FIG. 14, the influence of the molding tool 2 and/or the stamping roll 26 changes the distribution of the nanoparticles 45. The particles can form agglomerates and/or diffuse into deeper layers of the plastic film 4, and therefore particles having different orientation are disposed in deeper layers of the plastic film due to the rearrangement of the polymer chains, as a result of which the plasmon resonance is shifted spectrally or also disappears totally. As a result, the plastic film 4 can appear to be transparent after the hot stamp process. This renders possible an optical quality check by the measurement of the absorption spectrum, and in spite of the application of a dye the method according to the invention is also suitable for plastic films 4 which shall appear to be colorless in the final application.

Figure 15:
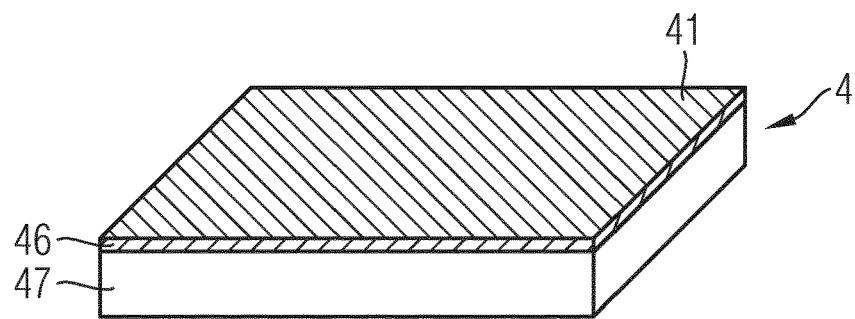
FIG. 15 shows the first method step of a hot stamping method according to the invention in a second embodiment.
Figure 16:
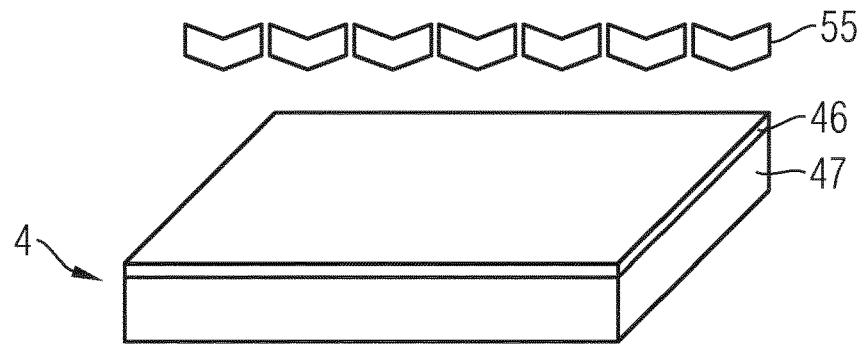
FIG. 16 shows a second method step of the hot stamping method according to the invention in a second embodiment.
Figure 17:
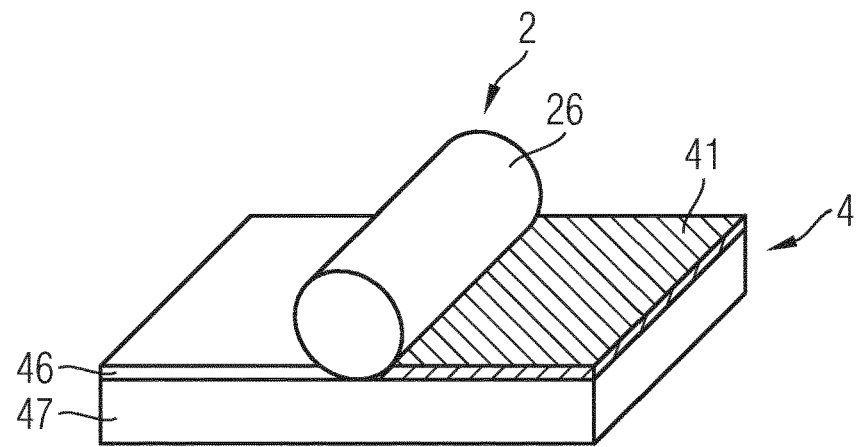
FIG. 17 shows the third method step of a hot stamping method according to the invention in a second embodiment.

FIGS. 15, 16 and 17 explain the hot stamping of a plastic film 4, which contains a first layer 47 and a second layer 46. The first layer 47 can contain a polymer which has a greater hardness and/or a higher deformation temperature than the second layer. The first layer 47 and the second layer 46 can be connected to one another, e.g. by all-over lamination and/or welding. In this way, plastic films 4 having the structure according to the invention can be provided even if they consist predominantly of a material that has a great hardness or a high deformation temperature and is not accessible to a known hot stamp method. For example, the first layer 47 can consist of polyether ether ketone.

As shown in FIG. 16, the heating device 55 can emit an electromagnetic radiation which is selectively absorbed by the material of the second layer 46. As a result, the heat input into the plastic film 4 can be limited to a layer bordering on the first side 41, as described above. Therefore, the mechanical stability of the plastic film 4 is guaranteed during the hot stamp process.

As shown in FIG. 17, the second layer 46 of the plastic film 4 is cooled after the molding process initiated by the molding tool 2 and subsequently wound onto a feed roll, as already described by means of FIG. 11. Since during the entire hot stamp process the first layer 47 is not heated above the deformation temperature, thus maintaining its mechanical stability, permanent film stripping forces can be ensured, thus increasing the product quality.

The plastic components 3 and/or plastic films 4 proposed according to the invention can be used as a cell culture substrate which has a surface structure that is similar to physiological surfaces. The comparatively large first structural elements create surfaces which can be compared with natural tissue and initiate the growth and/or the attachment of cells by confining natural binding sites. The comparatively small second structural elements 12 can serve to receive functional groups, e.g. proteins. Alternatively or additionally, the second structural elements can serve as a reservoir for pharmaceutical active substances and/or nutrients, which can positively influence the cell growth.

In other embodiments of the invention, a plastic component 3 according to the invention can serve as an active substance carrier for pharmaceutical active substances. As a result, a medicinal product can be transported under controlled conditions to its site of action in a human or animal body where it is released in controlled fashion within a desired period of time. Due to this, the employed active substance amount can be reduced.

Finally, plastic components 3 having the surface structure according to the invention can be used as an implant material. The plastic components can have a load-bearing core which permits a reliable osteosynthesis. On account of the microstructure and nanostructure according to the invention, the implants according to the invention can grow rapidly and reliably into the cartilage and bone tissues, as already described by means of the cell culture substrate. As a result, the formation of fibrous capsule tissue and thus painful tissue hardening, dislocations or rejection reactions can be prevented.

A further embodiment for the molding tools and plastic components according to the invention shall be shown below. The molding tool contains an aluminum alloy which is provided with a grid of horizontal and vertical grooves by means of laser material processing. These grooves take care that ridges having equal dimension are created in the subsequent casting. Each of the grooves produced by laser material processing has a width of 50 µm and a depth of 100 µm. The distance of the individual grooves is 50 µm each. As a result, the surface of the molding tool and/or the subsequently produced plastic component is already enlarged by a factor of 5 with respect to surface defined by the geometric dimensions of the plastic component.

Cylindrical, hexagonally arranged grooves having a diameter of 100 nanometers, a depth of 500 nanometers and a pore filling factor of 50% are applied to the surface enlarged already by the microstructure by anodic oxidation using the subsequent nanostructuring operation. The pore filling factor here designates the share of the pore area in the total area. The nanostructure covers the entire surface of the molding tool, including the boundary surfaces of the microstructure produced in the preceding method step. As a result, the surface is additionally enlarged by a factor of 10, and therefore the entire enlargement of the surface by the structure according to the invention is about 50 times that of the originally planar surface.

Of course, the invention is not limited to the embodiments shown in the drawings. Therefore, the above description shall not be considered to be limiting but explanatory. The below claims should be understood such that a stated feature is present in at least one embodiment of the invention. This does not rule out the presence of further features. Insofar as the claims and the above description define "first" and "second" features, this designation serves to distinguish between two equivalent features without determining a sequence.

The invention claimed is:

1. A method for hot stamping a plastic film, comprising the steps of:
    providing at least a first surface of the plastic film with a dye containing nanoparticles including at least one metal;
    exposing the plastic film to electromagnetic radiation, thereby stimulating plasmon resonances on the surface of said nanoparticles to heat at least part of said plastic film above a deformation temperature of the plastic film; and
    molding said at least part of the plastic film with a molding tool for structuring the plastic film, wherein the molding tool includes a first structural element and a second structural element, the second structural element being smaller than the first structural element.

2. The method of claim 1, wherein said step of providing at least a first surface of the plastic film with a dye comprises:
    depositing the nanoparticles on the plastic film in such a way that they are separated from one another.

3. The method of claim 1, wherein said step of providing at least a first surface of the plastic film with a dye comprises:
    applying the nanoparticles to the plastic film by means of a PVD method.

4. The method of claim 1, comprising the step of:
    selecting the nanoparticle and the wavelength of the electromagnetic radiation to result in a ratio of the size of the nanoparticle to the wavelength of the electromagnetic radiation is about 0.1 to about 1.

5. The method of claim 1, comprising the step of:
    measuring the optical transmission of the plastic film during the steps of exposing or molding.

6. The method of claim 1, comprising the step of:
    providing a plastic film consisting of a plurality of individual layers of different plastic materials.

7. The method of claim 1, comprising the step of:
    providing a plastic film including at least one first layer and at least one second layer, the first layer comprising one or more plastics selected from a group consisting of UHMW-PE, PEEK, PET, and PA and the second layer comprising one or more plastics selected from a group consisting of HD-PE, PS, PP, and a fluoropolymer.

* * * * *